United States Patent
Baluja et al.

(10) Patent No.: US 10,612,135 B2
(45) Date of Patent: Apr. 7, 2020

(54) METHOD AND SYSTEM FOR HIGH TEMPERATURE CLEAN

(71) Applicant: Applied Materials, Inc., Santa Clara, CA (US)

(72) Inventors: Sanjeev Baluja, Campbell, CA (US); Kalyanjit Ghosh, San Jose, CA (US); Ren-Guan Duan, Fremont, CA (US); Mayur G. Kulkarni, Bangalore (IN); Gregory Siu, Saratoga, CA (US); Praket P. Jha, San Jose, CA (US); Deenesh Padhi, Sunnyvale, CA (US); Lei Guo, Santa Clara, CA (US); Wei Min Chan, Sunnyvale, CA (US); Ajit Balakrishna, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/654,436

(22) Filed: Jul. 19, 2017

(65) Prior Publication Data

US 2018/0023193 A1 Jan. 25, 2018

Related U.S. Application Data

(60) Provisional application No. 62/364,201, filed on Jul. 19, 2016.

(51) Int. Cl.
*C23C 16/44* (2006.01)
*H01J 37/32* (2006.01)
*C23C 16/455* (2006.01)

(52) U.S. Cl.
CPC ...... *C23C 16/4405* (2013.01); *C23C 16/4408* (2013.01); *C23C 16/45519* (2013.01);
(Continued)

(58) Field of Classification Search
CPC ............ C23C 16/4405; C23C 16/4408; C23C 16/45519; H01J 37/00
See application file for complete search history.

(56) References Cited

U.S. PATENT DOCUMENTS 7,816,272 B2 10/2010 Tsutae
2002/0134514 A1* 9/2002 Yeh ................... H01L 21/67017
156/345.55

(Continued)

*Primary Examiner* — Sharidan Carrillo
(74) *Attorney, Agent, or Firm* — Patterson + Sheridan LLP

(57) ABSTRACT

Embodiments disclosed herein generally relate to systems and methods to prevent free radical damage to sensitive components in a process chamber and optimizing flow profiles. The processing chamber utilizes a cover substrate on lift pins and an inert bottom purge flow to shield the substrate support from halogen reactants. During a clean process, the cover substrate and the purge flow restricts halogen reactants from contacting the substrate support. The method of cleaning includes placing a cover substrate on a plurality of lift pins that extend through a substrate support in a processing chamber, raising the cover substrate via the lift pins to expose a space between the cover substrate and the substrate support, supplying a halogen containing gas into the processing chamber, supplying a second gas through an opening in the processing chamber, and flowing the second gas through the space between the cover substrate and the substrate support.

20 Claims, 5 Drawing Sheets

(52) U.S. Cl.
CPC .. *H01J 37/32449* (2013.01); *H01J 37/32715* (2013.01); *H01J 37/32862* (2013.01); *H01J 37/32871* (2013.01)

(56) References Cited

U.S. PATENT DOCUMENTS

| | | | |
|---|---|---|---|
| 2012/0237693 A1 | 9/2012 | Jackson et al. | |
| 2013/0087309 A1* | 4/2013 | Volfovski | H01L 21/67109 165/61 |
| 2013/0256267 A1* | 10/2013 | Ota | B44C 1/227 216/62 |
| 2015/0147830 A1* | 5/2015 | Iliopoulos | H01J 37/3288 438/17 |
| 2016/0181088 A1* | 6/2016 | Ghosh | H01J 37/32477 438/778 |
| 2016/0322234 A1* | 11/2016 | Lew | H01L 21/3247 |

* cited by examiner

METHOD AND SYSTEM FOR HIGH TEMPERATURE CLEAN

CROSS-REFERENCE TO RELATED APPLICATIONS

This application claims benefit of U.S. provisional patent application Ser. No. 62/364,201, filed Jul. 19, 2016, which is herein incorporated by reference.

BACKGROUND

Field of the Disclosure

Embodiments described herein generally relate to cleaning a processing chamber. More specifically, embodiments disclosed herein relate to a cover substrate on lift pins for processing temperatures greater than about 650 degrees Celsius while shielding chamber components from damage.

Description of the Related Art

In the fabrication of integrated circuits, deposition processes such as chemical vapor deposition (CVD) or plasma enhanced CVD processes are used to deposit films of various materials upon semiconductor substrates. These depositions may take place in an enclosed process chamber. The process gases are used to deposit films on the substrate, but also deposit residue on the internal walls and other components of the process chamber. This residue builds up as more substrates are processed in the chamber and leads to generation of particles and other contaminants. These particles and contaminants can lead to the degradation of the deposited films on the substrates causing product quality issues. Process chambers must be periodically cleaned to remove the deposited residues on the chamber components.

The process gases may be supplied to a substrate positioned on a substrate support. A purge gas may be provided to remove process gases. The process gas and the purge gas may be removed from the process chamber using a common exhaust disposed away from the process area, such as around an outer perimeter of the process chamber, to prevent mixing of the purge gas with the process gas in the process area. Using the arrangement described above, particle formation can occur in the process area above the substrate and cause defects in the products made in the process chamber.

Furthermore, substrate processing temperatures are typically capped between about 400 degrees Celsius and about 480 degrees Celsius for silicon based depositions due to the aggressive erosion and corrosion by the halogen clean on the high temperature components. As such, optimal film quality is often sacrificed due to manufacturability and reliability concerns.

Thus, there is a need for an improved system and method to prevent damage to sensitive components.

SUMMARY

Embodiments disclosed herein generally relate to systems and methods to prevent free radical damage to sensitive components in a process chamber and to enhance flow profiles. The processing chamber utilizes a cover substrate supported on lift pins and an inert bottom purge flow to shield the substrate support from halogen reactants such that the substrate support may be heated to temperatures greater than about 650 degrees Celsius. During a clean process, the cover substrate and the purge flow restricts halogen reactants from contacting the substrate support.

In one embodiment, a method of cleaning is disclosed. The method includes placing a cover substrate on a plurality of lift pins. The lift pins extend through a substrate support disposed in a processing chamber. The method also includes raising the cover substrate via the lift pins to expose a space between the cover substrate and the substrate support, supplying a halogen containing gas via a showerhead into the processing chamber, supplying a second gas through an opening in the processing chamber, and flowing the second gas through the space between the cover substrate and the substrate support.

In another embodiment, a method of cleaning is disclosed. The method includes placing a cover substrate on a plurality of lift pins. The lift pins extend through a substrate support disposed in a processing chamber. The method also includes raising the cover substrate via the lift pins to expose a space between the cover substrate and the substrate support, supplying a halogen containing gas via a showerhead into the processing chamber, supplying a second gas through an opening in the processing chamber, flowing the second gas through the space between the cover substrate and the substrate support, and supplying a third gas through a second opening in the processing chamber. The second opening is orthogonal to the first opening. The method also includes flowing the third gas in the space between the cover substrate and the substrate support.

In another embodiment, a method of cleaning is disclosed. The method includes placing a cover substrate on a plurality of lift pins. The lift pins extend through a substrate support disposed in a processing chamber. The method also includes raising the cover substrate via the lift pins to expose a space between the cover substrate and the substrate support, supplying a halogen containing gas via a showerhead into the processing chamber, supplying a second gas through an opening in the processing chamber, flowing the second gas through the space between the cover substrate and the substrate support, and supplying a third gas through a second opening in the processing chamber. The second opening is orthogonal to the first opening. The method also includes flowing the third gas in the space between the cover substrate and the substrate support. The halogen containing gas, the second gas, and the third gas flow simultaneously.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally relate to systems and methods to prevent free radical damage to sensitive components in a process chamber and optimizing flow profiles. The processing chamber utilizes a cover substrate on lift pins and an inert bottom purge flow to shield the substrate support from halogen reactants such that the substrate support may be heated to temperatures greater than about 650 degrees Celsius. During a clean process, the cover substrate and the purge flow restricts halogen reactants from contacting the substrate support.

Figure 1A:
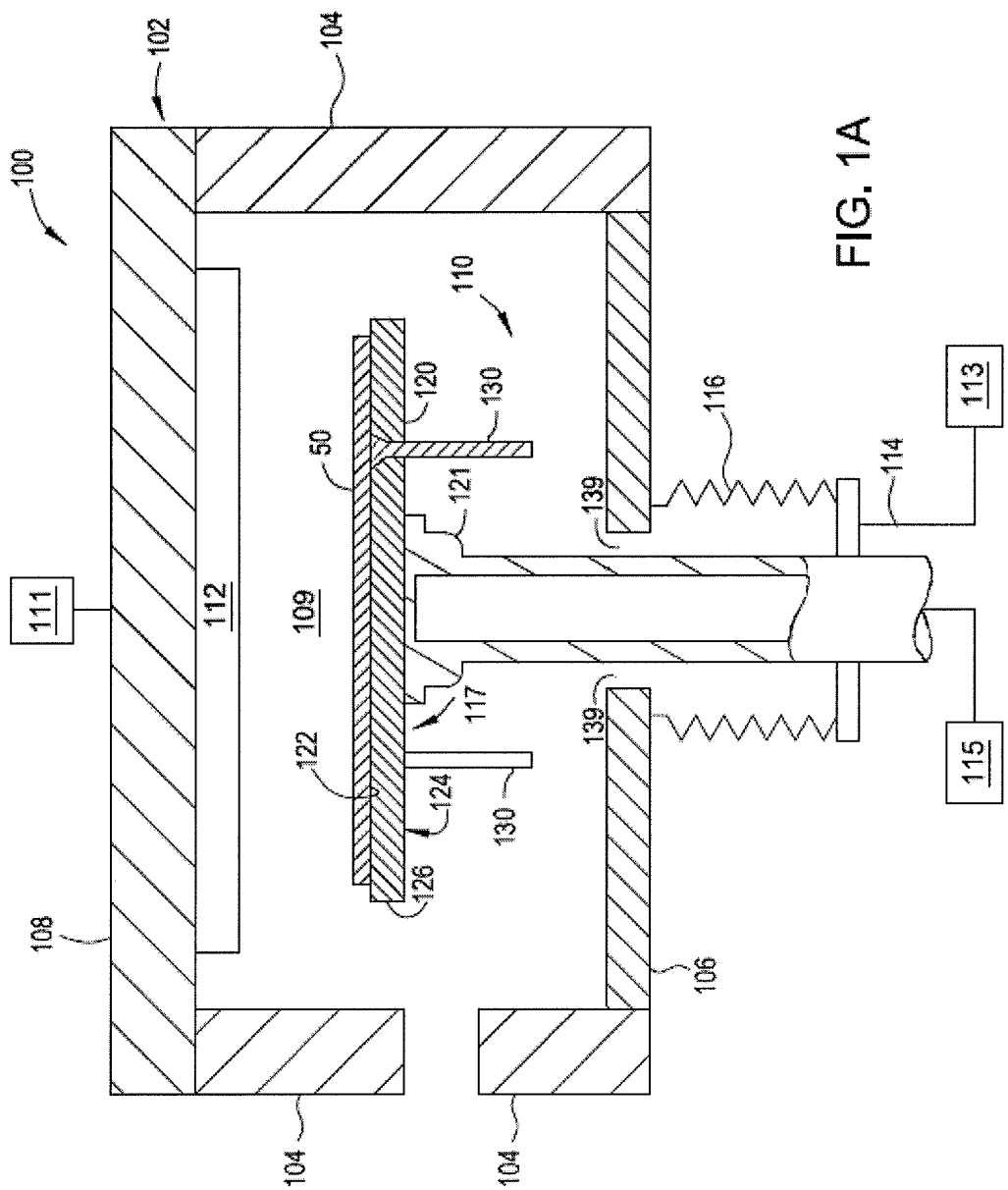
FIG. 1A is a side sectional view of a process chamber having a substrate in a raised position during processing, according to one embodiment of the disclosure.
Figure 1B:
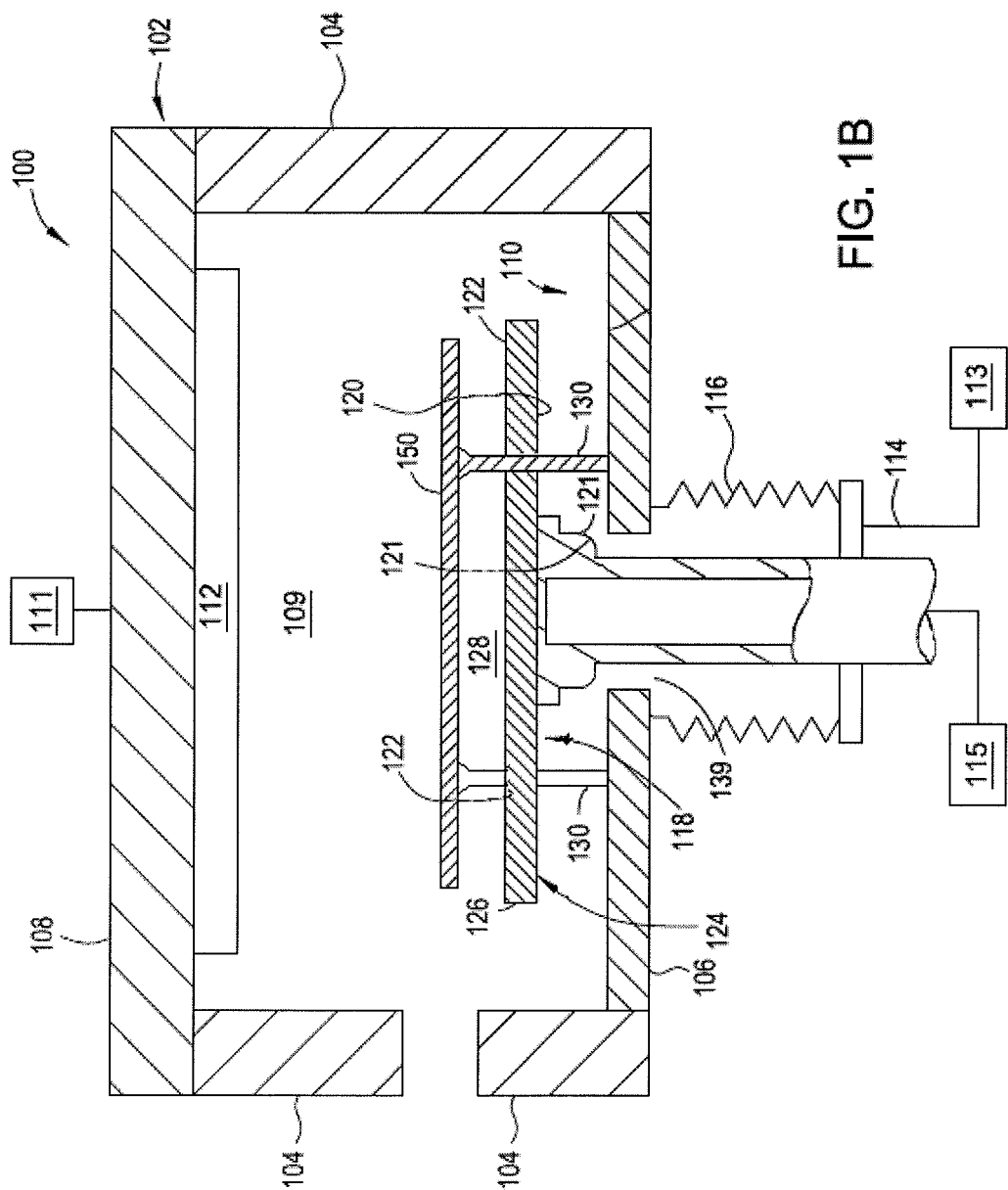
FIG. 1B is a side sectional view of the process chamber having a substrate in a lowered position for chamber cleaning, according to one embodiment of the disclosure.

FIG. 1A is a side sectional view of a process chamber 100 including a substrate support 120 in a raised position 117, according to one embodiment of the disclosure. FIG. 1B is a side sectional view of the process chamber 100 including the substrate support 120 in a lowered position 118, according to one embodiment of the disclosure. The sectional views of FIGS. 1A and 1B are cross-sectional views, so that parts behind or at other depths through the plane of the Figure are not shown in the drawings for clarity. For example, FIG. 1A may further include additional parts of a process kit, however, certain parts were omitted in order to not clutter the drawing and to make the gas flow of the process gas and purge gas discussed below easier to understand.

The process chamber 100 includes a substrate 50, a plurality of lift pins 130, a chamber body 102 having one or more side walls 104, a bottom 106, and a lid 108 disposed on the side walls 104. The side walls 104, bottom 106, and lid 108 define an interior volume 110 of the process chamber 100. The process chamber 100 includes a gas distribution plate 112 and the substrate support 120. The region between the substrate support 120 in the raised position 117 (FIG. 1A) and the gas distribution plate 112 is defined by the process volume 109. The gas distribution plate 112 supplies process gases from a process gas source 111 to the process volume 109. The process chamber 100 may be a plasma chamber, such as a chamber including a plasma source (e.g., a capacitively coupled plasma chamber with a RF-hot gas distribution plate) or a chamber connected to a remote plasma source (RPS).

The substrate support 120 is disposed in the interior volume 110. The substrate support 120 may be formed of a ceramic material, such as aluminum nitride. The substrate support 120 may include an electrostatic chuck, a ceramic body, a heater, a vacuum chuck, a susceptor, or a combination thereof. The substrate support 120 has a substrate supporting surface 122 that receives and supports the substrate 50 during processing. During a clean process, the substrate supporting surface 122 of the substrate support 120 may receive a cover substrate 150 to protect the underlying substrate support 120. In some embodiments, the cover substrate 150 may comprise a halogen resistant material.

The cover substrate 150 is configured to reduce particle deposition on the chamber components and prevent a purge gas from entering a process volume 109 above the substrate support 120, which advantageously reduces defects and increases the service interval. The cover substrate 150 protects chamber components from energized gases during processing and cleaning of the process chamber 100. The plurality of lift pins 130 provide for a space 128 between the cover substrate 150 and the supporting surface 122 of the substrate support 120. The plurality of lift pins 130 raise the cover substrate 150 to advantageously control a flow profile of the purge gas such that during cleaning the bottom purge flow restricts reactants and/or by-products from damaging the substrate support 120. During the cleaning process, the cover substrate 150 shields the substrate support 120 from free radical damage caused by process gases while the space 128 advantageously provides a flow path for purge gases to flow further protecting the substrate support 120 from free radical damage caused by process gases. By way of example only, purge gases may include inert gases and/or $O_2$, among others. In one embodiment, the purge gas may be argon.

The substrate support 120 is coupled to a supporting shaft 121 that is coupled to a lift mechanism 115 below the bottom 106 of the process chamber 100. A bellows 116 may disposed around the portion of the supporting shaft 121 that is below the bottom 106 of the process chamber to isolate the supporting shaft 121 from the external environment. The lift mechanism 115 is configured to move the substrate support 120 between the raised position 117 (see FIG. 1A) and the lowered position 118 (see FIG. 1B). The substrate support 120 may be placed in the raised position 117 for processing of the substrate 50. In the lowered position 118, a robot or other transfer mechanism may be used to place the cover substrate 150 in the process chamber 100 in preparation for cleaning, such as placing the substrate 50 on the plurality of lift pins 130 extending above the substrate support 120. The substrate support 120 further includes a bottom surface 124 and an outer surface 126.

The purge gas may be supplied to the process chamber 100 during processing or cleaning of the process chamber 100. The purge gas may be supplied from a purge gas source 113 through a purge gas line 114. In some embodiments, the purge gas line 114 may be coupled to the process chamber 100 through the bellows 116 in order to maintain a positive pressure in the bellows during movement of the substrate support 120 by the lift mechanism 115. In another embodiment, the purge gas may be supplied through opening 139. The purge gas may be oxygen, or an inert gas, such as nitrogen or argon. The purge gas helps to prevent process gases from the gas distribution plate 112 from entering portions of the interior volume 110 below the substrate support 120 and depositing material on any of the components below the substrate support 120. Additionally, the purge gases flow through the space 128 to prevent free radical damage to the substrate support 120. Prevention of process gases below the substrate support 120 avoids unnecessary cleaning of the components below the substrate support 120. Thus, using the purge gas reduces overall clean time, increases the longevity of chamber components such as the substrate support 120, and increases throughput of the process chamber 100.

Figure 2A:
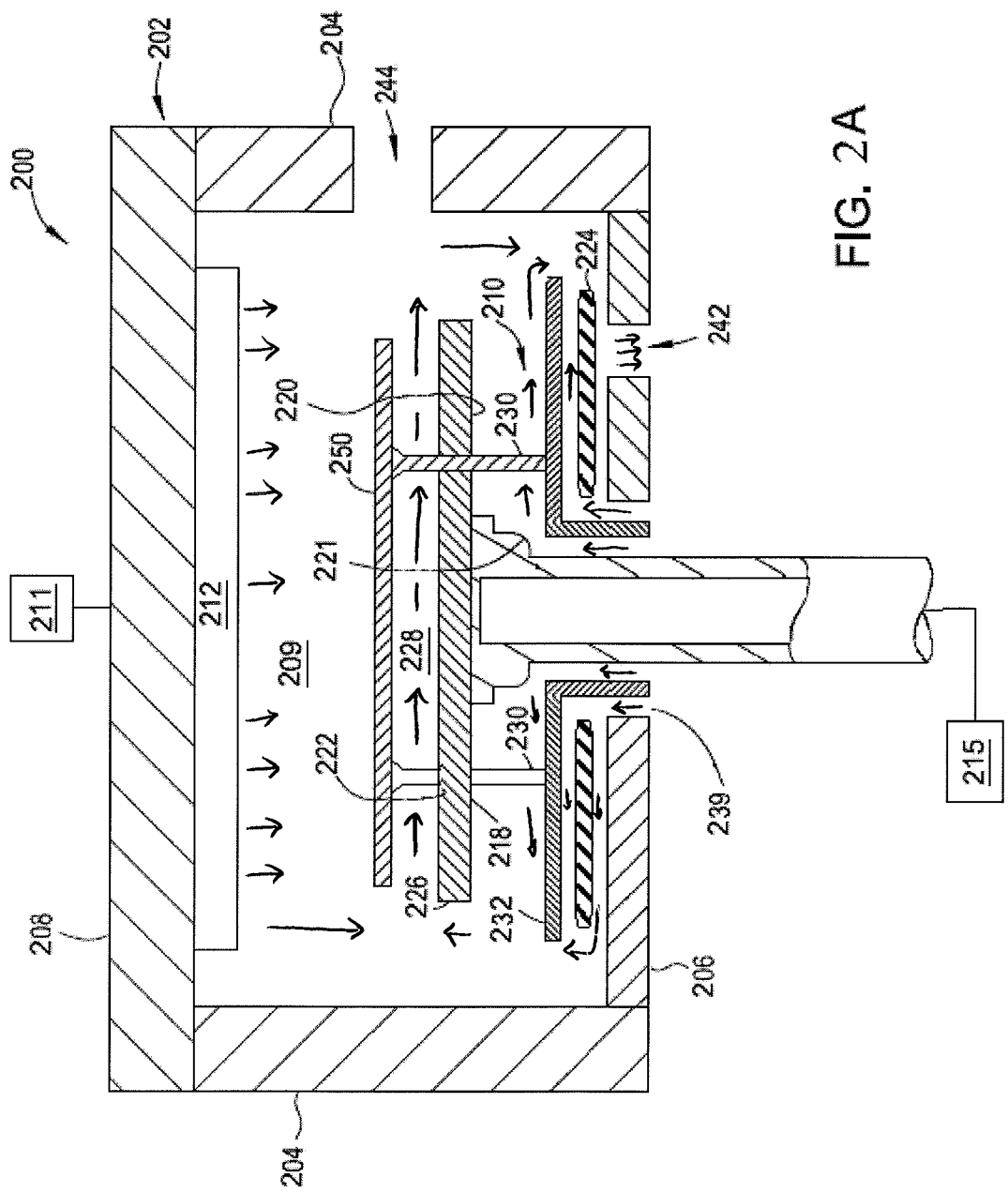
FIG. 2A is a cross-sectional side view of an improved process chamber having a substrate in a lowered position for chamber cleaning, according to another embodiment of the disclosure.
Figure 2B:
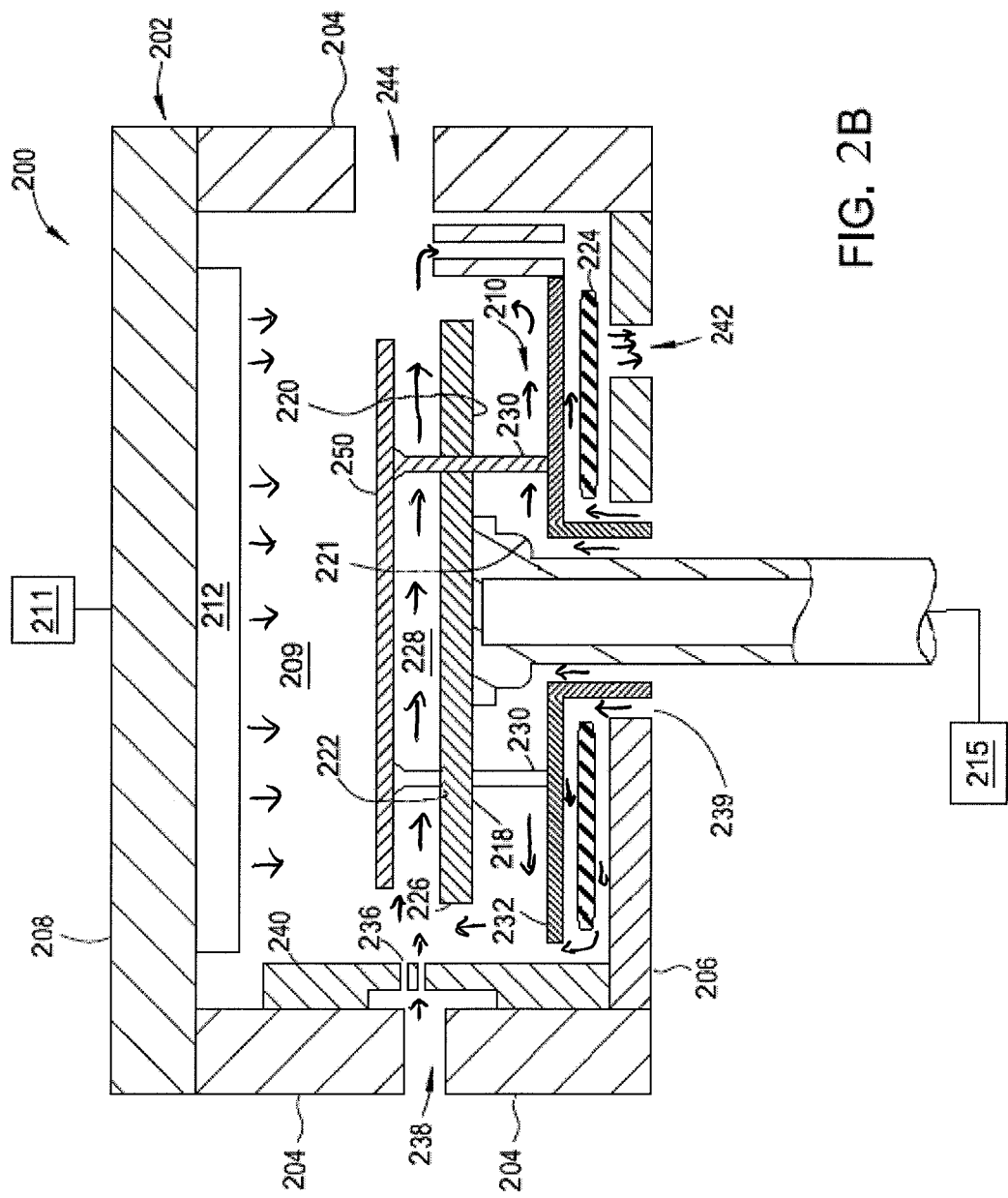
FIG. 2B is a cross-sectional side view of another improved process chamber having a substrate in a lowered position for chamber cleaning, according to another embodiment of the disclosure.

FIGS. 2A and 2B are cross-sectional side views of a process chamber 200, according to another embodiment of the disclosure. The process chamber 200 may be substantially similar to the process chamber 100. The process chamber 200 includes a cover substrate 250, a plurality of lift pins 230, a chamber body 202 having one or more side walls 204, a bottom 206, and a lid 208 disposed on the side walls 204, an interior volume 210, a gas distribution plate 212 coupled to a gas source 211 and supplying gas to a process volume 209, a supporting shaft 221 coupled to the substrate support 220, a lift mechanism 215 disposed below the bottom 206 of the process chamber 200 and configured to move the substrate support 220 between a raised and lowered portion, a pumping plate 224, a shielding plate 232, a bottom purge opening 239, an exhaust 242, and a slit valve 244. The substrate support 220 further includes a bottom surface 218, a top surface 222 opposite the bottom surface 218, and an outer surface 226. The substrate support 220 has a substrate supporting surface 222 that receives and supports a substrate during processing.

During a clean process for the chamber 200, a space 228 separates the substrate supporting surface 222 of the substrate support 220 and the cover substrate 150. In some embodiments, the cover substrate 250 may comprise a halogen resistant material. The cover substrate 250 is configured to reduce particle deposition on the chamber components and prevent a purge gas from entering a process volume 209 above the substrate support 220, which advantageously reduces defects and increases the service interval. The cover substrate 250 protects chamber components from energized gases during processing and cleaning of the process chamber 200. The plurality of lift pins 230 provide for the space 228 between the cover substrate 250 and the supporting surface 222 of the substrate support 220. The plurality of lift pins 230 raise the cover substrate 250 to advantageously control a flow profile of the purge gas such that during cleaning the bottom purge flow restricts reactants and/or by-products from damaging the substrate support 220. During the cleaning process, the cover substrate 250 shields the substrate support 220 from free radical damage caused by process gases while the space 228 advantageously provides a flow path for purge gases to flow further protecting the substrate support 220 from free radical damage caused by process gases. By way of example only, purge gases may include inert gases and/or $O_2$, among others. In one embodiment, the purge gas may be argon.

Figure 3:
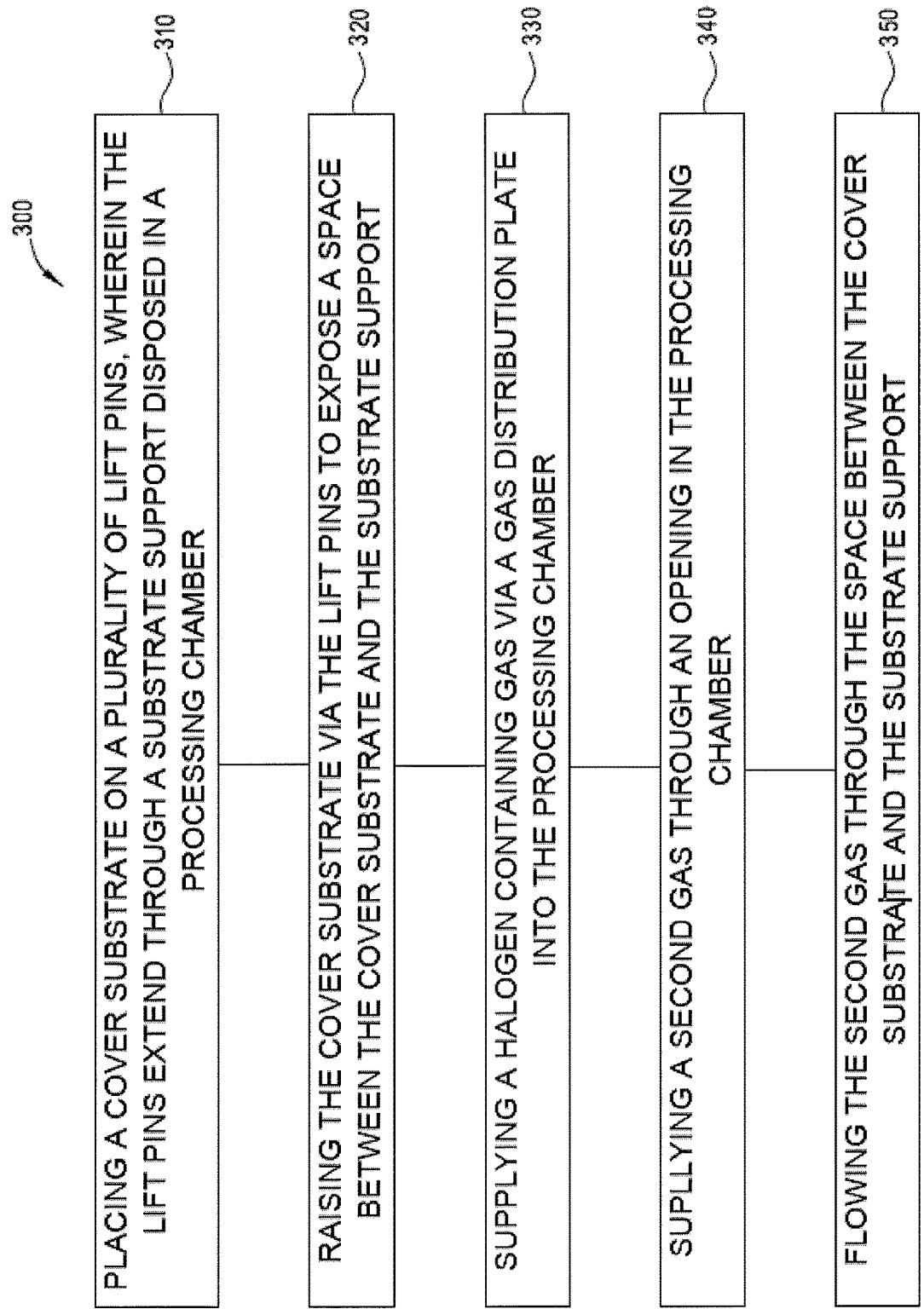
FIG. 3 is a flow diagram of a method for cleaning a process chamber, according to one embodiment of the disclosure.

During cleaning, at operation 310 of FIG. 3, a cover substrate 250 is placed on the plurality of lift pins 230. The plurality of lift pins 230 extend through the substrate support 220 in the process chamber 200. At operation 320, the lift pins 230 raise the cover substrate 250 to expose the space 228 between the cover substrate 250 and the substrate support 220. At operation 330, a process gas is supplied into the chamber via the gas distribution plate 212. In one embodiment the process gas is a halogen containing gas such as $NF_3$. In one embodiment the gas distribution plate 212 is a showerhead.

At operation 340 a second gas is supplied through the opening 239 in the processing chamber 200. The purge gas may be supplied from a purge gas source (not shown). The purge gas may be oxygen, or an inert gas, such as nitrogen or argon. The purge gas helps to prevent process gases from the gas distribution plate 212 from entering portions of the interior volume 210 below the substrate support 220 and depositing on any of the components below the substrate support 220. Additionally, at operation 350 the purge gases flow through the space 228 between the cover substrate 250 and the substrate support 220 to prevent free radical damage to the substrate support 220.

The purge gas enters the chamber through the bottom purge opening 239, flows on either side of the bottom shielding plate 232, flows around the pumping plate 224, flows around the outer surface 226 of the substrate support 220, flows across the top surface 222 of the substrate support and through the space 228, and exits the process chamber 200 through the exhaust 242. In one implementation, the purge gas is flowed simultaneously with the halogen containing gas. In another implementation, the purge gas is flowed before the halogen containing gas is flowed. The purge gas provided from below the substrate support 220 prevents process gases from reaching areas at the bottom of the chamber and causing deposit of residue in the areas below the substrate support 220. Additionally, the purge gas flows through space 228 below the substrate and prevents the process gas from forming free radicals on the substrate support 220 and causing damage to the substrate support 220. Prevention of process gases below and around the substrate support 220 avoids unnecessary cleaning of the components below the substrate support 220. Thus, using the purge gas reduces overall clean time, increases the longevity of chamber components such as the substrate support 220, and increases throughput of the process chamber 200.

As seen in FIG. 2B, the process chamber 200 may also include a side purge opening 238, a side purge plate 240, and purge plate openings 236. A third gas may be supplied to the process chamber 200 through the side purge opening 238. The third gas may be a purge gas such as argon. In one implementation, the purge gas is flowed simultaneously with the halogen containing gas. In another implementation, the second gas is flowed before the halogen containing gas is flowed. In another implementation, the third purge gas is flowed through the side purge opening 238 simultaneously with the second gas supplied through the opening 239. In other words, the third gas and the second gas are flowed before the halogen containing gas is supplied to the processing chamber. The purge gas may advantageously provide a side purge further directing the flow of gases through the space 228 below the substrate. The side purge plate 240 provides for even distribution of the purge gas through the purge plate openings 236 and controls the rate of flow of the side purge gas.

Benefits of the disclosure include the shielding of sensitive components from halogen damage such that a processing temperature greater than 650 degrees Celsius may be had, thus increasing and improving film quality and properties.

To summarize, the embodiments disclosed herein relate to a cover substrate on lift pins that protect a substrate support in a processing chamber during cleaning. The processing chamber utilizes an inert bottom purge flow to shield the substrate support from halogen reactants such that the substrate support may be heated to temperatures greater than about 650 degrees Celsius. Additionally, the lift pins and bottom purge direct and control the flow profile of the process gases away from the substrate support, such that free radical damage does not occur on the substrate support.

While the foregoing is directed to embodiments of the present disclosure, other and further embodiments of the disclosure may be devised without departing from the basic scope thereof, and the scope thereof is determined by the claims that follow.

What is claimed is:

1. A method of chamber cleaning, comprising:
  raising a substrate on a plurality of lift pins, wherein the lift pins extend through a substrate support disposed in a processing chamber, to expose a space between the substrate and the substrate support;

supplying a halogen containing gas via a gas distribution plate into the processing chamber;
supplying a second gas through a side purge opening in a sidewall of the processing chamber;
flowing the second gas through a purge plate opening in a side purge plate contained in the processing chamber;
flowing the second gas through the space between the substrate and the substrate support during chamber cleaning;
supplying a third gas through a bottom purge opening in the processing chamber, wherein the bottom purge opening is orthogonal to the purge plate opening; and
flowing the third gas from the bottom purge opening, around a pumping plate in the processing chamber, and between a shielding plate and a bottom of the processing chamber, wherein the pumping plate is disposed between at least a portion of the shielding plate and the bottom of the processing chamber.

2. The method of claim 1, wherein the second gas is an inert gas, and wherein the gas distribution plate is coupled to a lid of the processing chamber.

3. The method of claim 1, further comprising flowing the third gas in the space between the substrate and the substrate support during chamber cleaning.

4. The method of claim 1, wherein the halogen containing gas is $NF_3$.

5. The method of claim 1, wherein the bottom purge opening in the processing chamber is located at the bottom of the processing chamber, and wherein an exhaust is located at the bottom of the processing chamber.

6. The method of claim 1, further comprising flowing the halogen containing gas into the processing chamber.

7. The method of claim 1, further comprising flowing the third gas from the bottom purge opening through an interior volume underneath the substrate support to the space.

8. The method of claim 6, wherein the halogen containing gas and the second gas flow into the processing chamber simultaneously.

9. The method of claim 6, wherein the halogen containing gas flows into the processing chamber after the second gas flows into the processing chamber.

10. A method of cleaning, comprising:
raising a substrate on a plurality of lift pins, wherein the lift pins extend through a substrate support disposed in a processing chamber, to expose a space between the substrate and the substrate support;
supplying a halogen containing gas via a gas distribution plate into the processing chamber;
supplying a second gas through a side purge opening in the processing chamber;
flowing the second gas through the space between the substrate and the substrate support during chamber cleaning;
supplying a third gas through a bottom purge opening in the processing chamber, wherein the bottom purge opening is orthogonal to the side purge opening;
flowing the third gas from the bottom purge opening through an interior volume underneath the substrate support;
flowing the third gas from the bottom purge opening, around a pumping plate in the processing chamber, and between a shielding plate and a bottom of the processing chamber, wherein the pumping plate is disposed between at least a portion of the shielding plate and the bottom of the processing chamber; and
flowing the third gas in the space between the substrate and the substrate support during chamber cleaning.

11. The method of claim 10, wherein the second gas is an inert gas, and wherein the gas distribution plate is coupled to a lid of the processing chamber.

12. The method of claim 10, wherein the bottom purge opening in the processing chamber is located at the bottom of the processing chamber.

13. The method of claim 10, wherein the third gas is argon.

14. The method of claim 10, further comprising purging the halogen containing gas, the second gas, and the third gas through an exhaust at the bottom of the processing chamber.

15. The method of claim 10, further comprising flowing the halogen containing gas into the processing chamber.

16. The method of claim 15, wherein the halogen containing gas, the second gas, and the third gas flow simultaneously.

17. The method of claim 15, wherein the halogen containing gas flows into the processing chamber after the second gas flows into the processing chamber.

18. The method of claim 15, wherein the halogen containing gas is $NF_3$.

19. The method of claim 17, wherein the second gas and third gas flow simultaneously.

20. A method of cleaning, comprising:
raising a substrate on a plurality of lift pins, wherein the lift pins extend through a substrate support disposed in a processing chamber, to expose a space between the substrate and the substrate support;
supplying a halogen containing gas via a gas distribution plate into the processing chamber;
supplying a second gas through a side purge opening in a sidewall of the processing chamber;
flowing the second gas through a purge plate opening in a side purge plate contained in the processing chamber;
flowing the second gas through the space between the substrate and the substrate support during chamber cleaning;
supplying a third gas through a bottom purge opening in the processing chamber, wherein the bottom purge opening is orthogonal to the side purge opening;
flowing the third gas from the bottom purge opening through an interior volume underneath the substrate support;
flowing the third gas from the bottom purge opening, around a pumping plate in the processing chamber, and between a shielding plate and a bottom of the processing chamber, wherein the pumping plate is disposed between at least a portion of the shielding plate and the bottom of the processing chamber; and
flowing the third gas in the space between the substrate and the substrate support during chamber cleaning, wherein the halogen containing gas, the second gas, and the third gas flow simultaneously.

* * * * *